(12) United States Patent
Thomsen et al.

(10) Patent No.: US 8,022,291 B2
(45) Date of Patent: Sep. 20, 2011

(54) METHOD OF MAKING FRONT ELECTRODE OF PHOTOVOLTAIC DEVICE HAVING ETCHED SURFACE AND CORRESPONDING PHOTOVOLTAIC DEVICE

(75) Inventors: Scott V. Thomsen, South Lyon, MI (US); Yiwei Lu, Ann Arbor, MI (US); Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 385 days.

(21) Appl. No.: 12/285,890

(22) Filed: Oct. 15, 2008

(65) Prior Publication Data

US 2010/0089444 A1    Apr. 15, 2010

(51) Int. Cl.
H01L 31/00 (2006.01)
H01L 21/00 (2006.01)
C23C 14/00 (2006.01)

(52) U.S. Cl. ...... 136/256; 438/19; 438/798; 204/192.17
(58) Field of Classification Search .................. 136/256; 204/192.17; 438/19, 798
See application file for complete search history.

(56) References Cited

U.S. PATENT DOCUMENTS

| | | |
|---|---|---|
| 3,411,934 A | 11/1968 | Englehart et al. |
| 4,155,781 A | 5/1979 | Diepers |
| 4,162,505 A | 7/1979 | Hanak |
| 4,163,677 A | 8/1979 | Carlson et al. |
| 4,213,798 A | 7/1980 | Williams et al. |
| 4,378,460 A | 3/1983 | Williams |
| 4,532,373 A | 7/1985 | Matsuura et al. |
| 4,554,727 A | 11/1985 | Deckman et al. |
| 4,598,306 A | 7/1986 | Nath et al. |
| 4,663,495 A | 5/1987 | Berman et al. |
| 4,689,438 A | 8/1987 | Fukatsu et al. |

(Continued)

FOREIGN PATENT DOCUMENTS

DE    19713215    8/1998

(Continued)

OTHER PUBLICATIONS

Cooray, Nawalage F. et al., "Optimization of Al-doped ZnO Window Layers for Large-Area Cu(InGa)Se2-Based Modules by RF/DC/DC Multiple Magnetron Sputtering", 1999, Jpn. J. Appl. Phys. vol. 38, pp. 6213-6218.*

(Continued)

*Primary Examiner* — Basia Ridley
*Assistant Examiner* — Tamir Ayad
(74) *Attorney, Agent, or Firm* — Nixon & Vanderhye P.C.

(57) ABSTRACT

Certain example embodiments of this invention relate to a photovoltaic (PV) device including an electrode such as a front electrode/contact, and a method of making the same. In certain example embodiments, the front electrode has a textured (e.g., etched) surface that faces the photovoltaic semiconductor film of the PV device. The front electrode has a transparent conductive oxide (TCO) film having first and second layers (continuous or discontinuous) of the same material (e.g., zinc oxide, zinc aluminum oxide, indium-tin-oxide, or tin oxide), where the first TCO layer is sputter-deposited using a ceramic sputtering target(s) and the second TCO layer of the same material is sputter-deposited using a metallic or substantially metallic sputtering target(s). This allows the better quality TCO of the film, deposited more slowly via the ceramic target(s), to be formed using the ceramic target and the lesser quality TCO of the film to be deposited more quickly and cost effectively via the metallic target(s). After the etching, most or all of the better quality ceramic-deposited TCO remains whereas much of the lesser quality metallic-deposited TCO of the film was removed during the etching process.

15 Claims, 5 Drawing Sheets

U.S. PATENT DOCUMENTS

| | | | |
|---|---|---|---|
| 4,931,412 | A | 6/1990 | Fischer et al. |
| 4,940,495 | A | 7/1990 | Weber et al. |
| 5,073,451 | A | 12/1991 | Iida et al. |
| 5,091,764 | A | 2/1992 | Asaoka et al. |
| 5,110,637 | A | 5/1992 | Ando et al. |
| 5,131,954 | A | 7/1992 | Vogeli et al. |
| 5,171,411 | A | 12/1992 | Hillendahl et al. |
| 5,256,858 | A | 10/1993 | Tomb |
| 5,326,519 | A | 7/1994 | Claussen |
| 5,589,403 | A | 12/1996 | Toyama et al. |
| 5,603,778 | A | 2/1997 | Sonoda |
| 5,650,019 | A | 7/1997 | Yamada et al. |
| 5,667,853 | A | 9/1997 | Fukuyoshi et al. |
| 5,699,035 | A | 12/1997 | Ito et al. |
| 5,861,189 | A | 1/1999 | Sheel et al. |
| 5,891,556 | A | 4/1999 | Anderson et al. |
| 5,964,962 | A | 10/1999 | Sannomiya et al. |
| 6,043,427 | A * | 3/2000 | Nishimoto .................... 136/258 |
| 6,048,621 | A | 4/2000 | Gallego et al. |
| 6,123,824 | A | 9/2000 | Sano et al. |
| 6,187,824 | B1 | 2/2001 | Swank |
| 6,288,325 | B1 | 9/2001 | Jansen et al. |
| 6,344,608 | B2 | 2/2002 | Kariya et al. |
| 6,365,823 | B1 | 4/2002 | Kondo |
| 6,406,639 | B2 | 6/2002 | Sakaguchi et al. |
| 6,433,913 | B1 | 8/2002 | Bauer et al. |
| 6,469,438 | B2 | 10/2002 | Fukuoka et al. |
| 6,506,622 | B1 | 1/2003 | Shiozaki |
| 6,613,603 | B1 | 9/2003 | Sano |
| 6,627,322 | B2 | 9/2003 | Choi et al. |
| 6,686,050 | B2 | 2/2004 | Lingle et al. |
| 6,746,775 | B1 | 6/2004 | Boire et al. |
| 6,747,779 | B1 | 6/2004 | Morin et al. |
| 6,784,361 | B2 | 8/2004 | Carlson et al. |
| 6,825,409 | B2 | 11/2004 | Haussler et al. |
| 6,827,970 | B2 | 12/2004 | Varanasi et al. |
| 6,844,210 | B2 | 1/2005 | Fukuoka et al. |
| 6,852,555 | B1 | 2/2005 | Roman et al. |
| 6,933,672 | B2 | 8/2005 | Hosokawa |
| 6,936,347 | B2 | 8/2005 | Laird et al. |
| 6,963,168 | B2 | 11/2005 | Eida et al. |
| 6,963,383 | B2 | 11/2005 | Tokailin et al. |
| 6,972,750 | B2 | 12/2005 | Yu |
| 6,975,067 | B2 | 12/2005 | McCormick et al. |
| 6,979,414 | B2 | 12/2005 | Hosokawa |
| 6,987,547 | B2 | 1/2006 | Yang et al. |
| 6,989,280 | B2 | 1/2006 | Ko |
| 7,012,728 | B2 | 3/2006 | Morin et al. |
| 7,037,869 | B2 | 5/2006 | Landa et al. |
| 7,087,834 | B2 | 8/2006 | McFarland |
| 7,090,921 | B2 | 8/2006 | Stachowiak |
| 7,132,666 | B2 | 11/2006 | Nakata et al. |
| 7,141,863 | B1 | 11/2006 | Compaan et al. |
| 7,144,837 | B2 | 12/2006 | Landa et al. |
| 7,153,579 | B2 | 12/2006 | Kriltz et al. |
| 7,169,722 | B2 | 1/2007 | Landa et al. |
| 7,317,237 | B2 | 1/2008 | Niira et al. |
| 2003/0011047 | A1 | 1/2003 | Cunningham et al. |
| 2003/0064255 | A1 | 4/2003 | Dannenberg |
| 2003/0165693 | A1 | 9/2003 | Hartig et al. |
| 2003/0218153 | A1 | 11/2003 | Abe |
| 2004/0038051 | A1 | 2/2004 | Fujisawa et al. |
| 2004/0086723 | A1 | 5/2004 | Thomsen |
| 2004/0113146 | A1 | 6/2004 | Dahmani |
| 2004/0187914 | A1 | 9/2004 | Matsuda et al. |
| 2004/0244829 | A1 | 12/2004 | Rearick et al. |
| 2005/0016583 | A1 | 1/2005 | Blieske et al. |
| 2005/0042460 | A1 | 2/2005 | Kriltz |
| 2005/0257824 | A1 | 11/2005 | Maltby et al. |
| 2005/0258029 | A1 | 11/2005 | Muller et al. |
| 2006/0065299 | A1 | 3/2006 | Fukawa et al. |
| 2006/0099441 | A1 | 5/2006 | Teyssedre et al. |
| 2006/0169316 | A1 | 8/2006 | Thomsen et al. |
| 2006/0219988 | A1 | 10/2006 | Abe |
| 2006/0228564 | A1 | 10/2006 | Demiryont |
| 2006/0248923 | A1 | 11/2006 | Krasnov et al. |
| 2006/0249199 | A1 | 11/2006 | Thomsen et al. |
| 2006/0289055 | A1 | 12/2006 | Sridharan et al. |
| 2007/0029187 | A1 | 2/2007 | Krasnov |
| 2007/0120045 | A1 | 5/2007 | Yokoyama |
| 2007/0184573 | A1 | 8/2007 | Krasnov |
| 2007/0193624 | A1 | 8/2007 | Krasnov |
| 2007/0209698 | A1 | 9/2007 | Thomsen et al. |
| 2007/0215205 | A1 | 9/2007 | Thomsen et al. |
| 2008/0047602 | A1 | 2/2008 | Krasnov |
| 2008/0047603 | A1 | 2/2008 | Krasnov |
| 2008/0096376 | A1 * | 4/2008 | Li et al. .................... 438/597 |
| 2008/0105293 | A1 | 5/2008 | Lu et al. |
| 2008/0105298 | A1 | 5/2008 | Lu et al. |
| 2008/0105299 | A1 | 5/2008 | Krasnov |
| 2008/0105302 | A1 | 5/2008 | Lu et al. |
| 2008/0107799 | A1 | 5/2008 | Lu et al. |
| 2008/0163929 | A1 | 7/2008 | Krasnov |
| 2008/0169021 | A1 | 7/2008 | Krasnov |
| 2008/0178932 | A1 | 7/2008 | Den Boer et al. |
| 2008/0210303 | A1 | 9/2008 | Lu et al. |
| 2008/0223430 | A1 | 9/2008 | Krasnov et al. |
| 2008/0223436 | A1 | 9/2008 | den Boer et al. |
| 2008/0302414 | A1 | 12/2008 | den Boer et al. |
| 2008/0308145 | A1 | 12/2008 | Krasnov et al. |
| 2008/0308146 | A1 | 12/2008 | Krasnov et al. |
| 2008/0308151 | A1 | 12/2008 | den Boer et al. |
| 2009/0084438 | A1 | 4/2009 | den Boer et al. |
| 2009/0126791 | A1 | 5/2009 | Lu et al. |
| 2009/0194155 | A1 | 8/2009 | den Boer et al. |
| 2009/0194157 | A1 | 8/2009 | den Boer et al. |

FOREIGN PATENT DOCUMENTS

| | | |
|---|---|---|
| DE | 19958878 | 6/2001 |
| EP | 0 180 222 | 5/1986 |
| EP | 0 204 562 | 12/1986 |
| EP | 0 252 489 | 1/1988 |
| EP | 0 309 000 | 3/1989 |
| EP | 0 372 929 | 6/1990 |
| EP | 0 403 936 | 12/1990 |
| EP | 0 436 741 | 7/1991 |
| EP | 0 567 735 | 11/1993 |
| EP | 0 987 774 | 3/2000 |
| EP | 0 991 129 | 5/2000 |
| EP | 1 063 317 | 12/2000 |
| EP | 1 115 160 | 11/2001 |
| EP | 1 174 397 | 1/2002 |
| EP | 1 300 889 | 4/2003 |
| EP | 1 343 176 | 9/2003 |
| FR | 2551267 | 3/1985 |
| GB | 2188924 | 10/1987 |
| JP | 61-141185 | 6/1986 |
| JP | 61-278171 | 12/1986 |
| JP | 62-179165 | 8/1987 |
| JP | 02-106978 | 4/1990 |
| JP | 2164077 | 6/1990 |
| JP | 7122764 | 5/1995 |
| JP | 11-298030 | 10/1999 |
| JP | 2002-25350 | 1/2002 |
| WO | WO 94/25397 | 11/1994 |
| WO | WO 03/019598 | 3/2003 |
| WO | WO 2006/029073 | 3/2006 |
| WO | WO 2008/036769 | 3/2008 |
| WO | WO 2008/063305 | 5/2008 |
| WO | WO 2008/154128 | 12/2008 |

OTHER PUBLICATIONS

Fang, Guojia et al., "Fabrication and characterization of transparent conductive ZnO:Al thin films prepared by direct current magnetron sputtering with highly conductive ZnO(ZnAl2O4) ceramic target", 2003, Journal of Crystal Growth 247, pp. 393-400.*

Ellmer, K. et al., "D.c. and r.f. (reactive) magnetron sputtering of ZnO:Al films from metallic and ceramic targets: a comparative study", 1997, Surface and Coatings Technology 93, pp. 21-26.*

Loffl, Anton et al., "Solar Cell Having a Textured TCO layer and Also a Method for Manufacturing Such a TCO layer for Such a Solar Cell", English Human Translation of DE 19713215, pp. 1-23.*

Gerhardinger, Peter et al., "Fluorine Doped Tin Oxide Coatings—Over 50 Years and Going Strong", Mar. 2008, Key Engineering Materials, vol. 380, pp. 169-178.*

Japan Display' 89, Soda Lime Glass as a Substrate for TFT-LCDs, Uchikoga et al., pp. 426-429, International Display Research Conference.
"Numerical Modelling of Rear Junction SI Solar Cells Using Fermi-Dirac Statistics", Harder et al., FEIT-Engineering Australian National University, ACT 0200 (4pgs).
"Large-Area Deposition for Crystalline Silicon on Glass Modules", Basore, 3rd World Conference on Photovoltaic Energy Conversion, May 2003, (pp. 1-4).
"Physical Properties of Natively Textured Yttrium Doped Zinc Oxide Films by Sol-Gel", Kaur et al., Journal of Materials Science: Materials in Electronics 16 (2005) pp. 649-655.
"Highly Transparent and Conductive Rare Earth Doped ZnO Thin Films Prepared by Magnetron Sputtering", Minami et al., Kanazawa Institute of Technology, Thin Solid Films, vol. 366, pp. 63-68, 2000.
"The Band Structure and Work Function of Transparent Conducting Aluminum and Maganese Co-Doped Zinc Oxide Films", Cao et al., ActA Metallurgica Sinica (English Letters), vol. 18, No. 3, pp. 356-362, 2005.
"Al-Doped Zinc Oxide Films Deposited by Simultaneous fr and dc Excitation of a Magnetron Plasma: Relationships Between Plasma Parameters and Structural and Electrical Film Properties", Cebulla et al., J.Appl. Phys. 83 (2), Jan. 15, 1998.
"Novel Device Structure for Cu(In, Ga)Se2 Thin film Solar Cells Using Transparent Conducting Oxide Back and Front Contacts", Nakada et al., Solar Energy 77 (2004) 739-747.
"Improvement in Quantum Efficiency of Thin Film Si Solar Cells Due to the Suppression of Optical Reflectance at Transparent Conducting Oxide/Si Interface by Ti02/ZnO Antireflection Coating", Fujibayashi et al., Applied Physics Letters 88, (2006) (2pgs).
"Thin-Film Compound Semiconductor Photovoltaics", Shafarman et al., Materials Research Society, vol. 865, Mar. 29-Apr. 1, 2005.
"Improved Three-Dimensional Optical Model for Thin-Film Silicon Solar Cells", Springer et al., Journal of Applied Physics, vol. 96, No. 9, Nov. 1, 2004.
U.S. Appl. No. 11/600,912, filed Nov. 17, 2006.
"TCO and Light Trapping in Silicon Thin Film Solar Cells". Muller et al., Solar Energy 77 (2004) pp. 917-930.
"CdTe/CdS solar cells on flexible substrates", Mathew, Xavier et al., Solar Energy 77 (2004) 831-838.
New Transparent Conductors Anatase Ti1-xMxO2 (M=Nb, Ta): Transport and Optical Properties, Furubayashi et al., Materials Research Society, vol. 905E, 2006.
"Transparent Conductors and Barrier Layers for Thin Film Solar Cells", Gordon et al., Final Technical Report Jun. 15, 2001.
"TiO2-Coated TCO (SnO2:F) Films Prepared by AP-CVD with High Durability against Hydrogen Radicals". Kambe et al., 15th International Photovoltaic Science & Engineering Conference (PVSEC 15) China 2005.
"Self-Aligning, Industrially Feasible Back Contacted Silicon Solar Cells with Efficiencies >18%", Muller et al., 3rd World Conference on Photovoltaic Energy Conversion, May 11-18, 2003, Osaka, Japan.
"Role of the Glass/TCO Substrate in Thin film Silicon Solar Cells", Muller et al., WCPEC-3, Osaka, Japan, May 11-18, 2003.
"Enhancement of Light Trapping in Silicon Thin-Film Solar Cells by Optimizing From TCO and Back Reflector", Jeon et al. 15th Int. Photovoltaic Science & Engineering Conference, China, 2005.
"Recent Applications of Pulsed Lasers in Advanced Materials Processing", Booth, Thin Solid Films 453-454 (2004) pp. 450-457.
"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.

"Improved Transparent Conductive Oxide/p+/i Junction in Amorphous Silicon Solar Cells by Tailored Hydrogen Flux During Growth", Nuruddin et al., Thin Solid Films 394 (2001) pp. 49-63.
"Work Function Determination of Zinc Oxide Films", Sundaram et al., J. Vac. Sci. Technol. A. 15(2), Mar./Apr. 1997, pp. 428-430.
"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.
"Investigation of Indium Tin Oxide/Zinc Oxide Multilayer Ohmic Contacts to n-Type GaN Isotype Conjunction", Lee et al., Applied Physics Letters, vol, 78, No. 22, May 28, 2001, pp. 3412-3414.
"The Insert of Zinc Oxide Thin Film in Indium Tin Oxide Anode for Organic Electroluminescence Devices", Jeong et al., Current Applied Physics 4 (2004) 655-658.
U.S. Appl. No. 11/509,094, filed Aug. 24, 2006.
"TiN and TiO2:Nb Thin Film Preparation Using Hollow Cathode Sputtering with Application to Solar Cells", Guo et al., J. Vac. Sci. Technol. A 24(4) (Jul./Aug. 2006) pp. 1524-1529.
"Physical and Photoelectrochemical Properties of the TiO2-ZnO System", Yoon et al., Materials Research Bulletin, vol. 34, No. 9 (1999) pp. 1451-1461.
"Transparent Conducting Oxides (TCO's) for Amorphous Silicon Solar Cells", Hegedus et al., AIP Conf. Proc. vol. 353, No. 1 (1996) pp. 465-472.
"TiO2 Thin Films as Protective Material for Transparent-Conducting Oxides Used in Si Thin Film Solar Cells", Natsuhara et al., Solar Energy Materials & Solar Cells 90 (2006) pp. 2867-2880.
"Texture Etched ZnO:Al Coated Glass Substrates for Silicon Based Thin Film Solar Cells", Kluth et al., Thin Solid Films 351 (1999) pp. 247-253.
U.S. Appl. No. 11/507,660, filed Aug. 22, 2006.
U.S. Appl. No. 11/591,668, filed Nov. 2, 2006.
U.S. Appl. No. 11/591,676, filed Nov. 2, 2006.
U.S. Appl. No. 11/650,564, filed Jan. 8, 2007.
U.S. Appl. No. 11/653,431, filed Jan. 16, 2007.
U.S. Appl. No. 11/717,787, filed Mar. 14, 2007.
U.S. Appl. No. 11/790,687, filed Apr. 26, 2007.
U.S. Appl. No. 11/790,812, filed Apr. 27, 2007.
U.S. Appl. No. 11/812,078, filed Jun. 14, 2007.
U.S. Appl. No. 11/808,765, filed Jun. 12, 2007.
U.S. Appl. No. 11/898,641, filed Sep. 13, 2007.
U.S. Appl. No. 11/984,092, filed Nov. 13, 2007.
U.S. Appl. No. 11/987,664, filed Dec. 3, 2007.
U.S. Appl. No. 11/984,662, filed Nov. 20, 2007.
U.S. Appl. No. 12/068,117, filed Feb. 1, 2008.
U.S. Appl. No. 12/068,119, filed Feb. 1, 2008.
U.S. Appl. No. 12/149,263, filed Apr. 29, 2008.
U.S. Appl. No. 12/232,619, filed Sep. 19, 2008.
U.S. Appl. No. 12/285,374, filed Oct. 2, 2008.
U.S. Appl. No. 12/068,119, filed Feb. 1, 2008; den Boer et al.
U.S. Appl. No. 11/984,092, filed Nov. 13, 2007; den Boer et al.
U.S. Appl. No. 11/898,641, filed Sep. 13, 2007; Lu et al.
U.S. Appl. No. 11/591,668, filed Nov. 2, 2006; Lu et al.
U.S. Appl. No. 11/790,812, filed Apr. 27, 2007; Lu et al.
Self-Aligning, Industrially Feasible Back Contacted Silicon Solar Cells With Efficiencies >18%, Müller et al., 3rd World Conference on Photovoltaic Energy Conversion, May 11-18, 2003, Osaka, Japan.

* cited by examiner

METHOD OF MAKING FRONT ELECTRODE OF PHOTOVOLTAIC DEVICE HAVING ETCHED SURFACE AND CORRESPONDING PHOTOVOLTAIC DEVICE

Certain example embodiments of this invention relate to a photovoltaic (PV) device including an electrode such as a front electrode/contact and a method of making the same. In certain example embodiments, the front electrode has a textured (e.g., etched) surface that faces the photovoltaic semiconductor film of the PV device. In certain example embodiments, the front electrode is formed on a flat or substantially flat (non-textured) surface of a glass substrate, and after formation of the front electrode the surface of the front electrode is textured (e.g., via etching). In certain example embodiments, the front electrode comprises a transparent conductive oxide (TCO) film having first and second layers of the same material (e.g., zinc oxide, zinc aluminum oxide, indium-tin-oxide, or tin oxide), where the first TCO layer is sputter-deposited using a ceramic sputtering target(s) and the second TCO layer of the same material is sputter-deposited using a metallic or substantially metallic sputtering target(s). This allows the better quality TCO of the film, deposited more slowly via the ceramic target(s), to be formed using the ceramic target and the lesser quality TCO of the film to be deposited more quickly and cost effectively via the metallic target(s). After the etching, most or all of the better quality ceramic-deposited TCO remains whereas much of the lesser quality metallic-deposited TCO of the film was removed during the etching process. This allows the TCO of the front electrode to be formed in a more efficient and cost effective manner, resulting in a better and more competitive product. In completing manufacture of the PV device, the etched surface of the front electrode faces the active semiconductor film of the PV device.

BACKGROUND AND SUMMARY OF EXAMPLE EMBODIMENTS OF INVENTION

Photovoltaic devices are known in the art (e.g., see U.S. Pat. Nos. 6,784,361, 6,288,325, 6,613,603, and 6,123,824, the disclosures of which are hereby incorporated herein by reference). Amorphous silicon photovoltaic devices, for example, include a front electrode or contact. Typically, the transparent front electrode is made of a pyrolytic transparent conductive oxide (TCO) such as zinc oxide or tin oxide formed on a substrate such as a glass substrate. In many instances, the transparent front electrode is formed of a single layer using a method of chemical pyrolysis where precursors are sprayed onto the glass substrate at approximately 400 to 600 degrees C. Typical pyrolitic fluorine-doped tin oxide TCOs as front electrodes may be about 400 nm thick, which provides for a sheet resistance ($R_s$) of about 15 ohms/square. To achieve high output power, a front electrode having a low sheet resistance and good ohm-contact to the cell top layer, and allowing maximum solar energy in certain desirable ranges into the absorbing semiconductor film, are desired.

It would be desirable to provide a technique and structure for improving the ability of the semiconductor film (or absorber) of the photovoltaic (PV) device to absorb light and thus generate electrical charges.

Certain example embodiments of this invention relate to a photovoltaic (PV) device including an electrode such as a front electrode/contact and a method of making the same. In certain example embodiments, the front electrode has a textured (e.g., etched) surface that faces the photovoltaic semiconductor film of the PV device. The textured surface of the front electrode, facing the semiconductor absorber film, is advantageous in that it increases the amount of incoming radiation or solar energy that is absorbed by the semiconductor film of the PV device. In certain example embodiments, the front electrode is formed on a flat or substantially flat (non-textured) surface of a front glass substrate, and after formation of the front electrode via sputtering or the like, the surface of the front electrode is textured (e.g., via etching). In completing manufacture of the PV device, the textured (e.g., etched) surface of the front electrode faces the active semiconductor film (or absorber) of the PV device.

The use of a front electrode having a textured surface adjacent the semiconductor film (or absorber) is advantageous in that it increases the optical path of incoming solar light within the semiconductor film through light scattering, thereby increasing the chance for photons to be absorbed in the semiconductor film to generate electrical charge.

In certain example embodiments, the front electrode is of or includes a transparent conductive oxide (TCO) film having first and second layers of the same or substantially the same material (e.g., zinc oxide, zinc aluminum oxide, indium-tin-oxide, or tin oxide). The first TCO layer of the front electrode is sputter-deposited using a ceramic sputtering target(s), and the second TCO layer of the front electrode, of the same material, is sputter-deposited using a metallic or substantially metallic sputtering target(s). This allows the better quality TCO of the film, deposited more slowly via the ceramic target(s), to be formed using the ceramic target and the lesser quality TCO of the front electrode film to be deposited more quickly and cost effectively via the metallic target(s). After the etching, most or all of the better quality ceramic-deposited TCO remains whereas much of the lesser quality metallic-deposited TCO of the film was removed during the etching process and is no longer present. This allows the TCO of the front electrode to be formed in a more efficient and cost effective manner, resulting in a better and more competitive product. In completing manufacture of the PV device, the etched surface of the front electrode faces the active semiconductor film of the PV device.

In certain example embodiments of this invention, the front electrode of a photovoltaic device is comprised of a multi-layer coating including at least one conductive substantially metallic IR reflecting layer (e.g., based on silver, gold, or the like), and at least one transparent conductive oxide (TCO) layer (e.g., of or including a material such as zinc oxide or the like). In the PV device, the TCO is provided between the semiconductor film and the substantially metallic IR reflecting layer. The surface of the TCO layer may be etched to provide a textured or etched surface facing the semiconductor film. In other example embodiments, the front electrode may consist essentially of the TCO film having a first TCO layer and a second TCO layer of the same or substantially the same material, with a substantial part of the second TCO layer (but little or none of the first TCO layer) having been removed during the etching process.

In certain example embodiments of this invention, a multilayer front electrode coating may be designed to realize one or more of the following advantageous features: (a) reduced sheet resistance ($R_s$) and thus increased conductivity and improved overall photovoltaic module output power; (b) increased reflection of infrared (IR) radiation thereby reducing the operating temperature of the photovoltaic module so as to increase module output power; (c) reduced reflection and increased transmission of light in the region(s) of from about 450-1,000 nm, 450-700 nm and/or 450-600 nm which leads to increased photovoltaic module output power; (d) reduced total thickness of the front electrode coating which can reduce fabrication costs and/or time; (e) an improved or enlarged process window in forming the TCO layer(s) because of the reduced impact of the TCO's conductivity on the overall electric properties of the module given the presence of the highly conductive substantially metallic layer(s); and/or (f) increased optical path within the semiconductor film, due to the etched surface of the front electrode, through light scattering thereby increasing the chance for photons to be absorbed in the semiconductor film and through light trapping between the reflective metal back electrode(s) by multiple internal reflections so as to generate additional electrical charge.

In certain example embodiments of this invention, there is provided a method of making an electrode for a photovoltaic device, the method comprising: sputter-depositing a first transparent conductive oxide layer on a substrate using at least one ceramic sputtering target; sputter-depositing a second transparent conductive oxide layer using at least one metallic sputtering target to form a transparent conductive oxide film comprising the first and second transparent conductive oxide layers, wherein the second transparent conductive oxide layer directly contacts the first transparent conductive oxide layer and is of the same metal oxide material as the first transparent conductive oxide layer; and after said sputter-depositing steps, etching the transparent conductive oxide film to form a textured surface, wherein a substantial portion of the second transparent conductive oxide layer is removed during said etching and a majority of said first transparent conductive oxide layer remains after said etching.

In other example embodiments, there is provided a photovoltaic device comprising: a front glass substrate; a front electrode provided between the front glass substrate and a semiconductor film of the photovoltaic device, wherein the front electrode comprises a transparent conductive oxide (TCO) film comprising first and second TCO layers of the same TCO metal oxide material which directly contact each other, the first TCO layer being more dense than the second TCO layer of the same TCO material; wherein a major surface of the TCO film layer closest to a semiconductor film of the photovoltaic device is etched so as to be textured, and wherein the second TCO layer is closest to the semiconductor film and is discontinuous due to the etching.

DETAILED DESCRIPTION OF EXAMPLE EMBODIMENTS OF THE INVENTION

Figure 1:
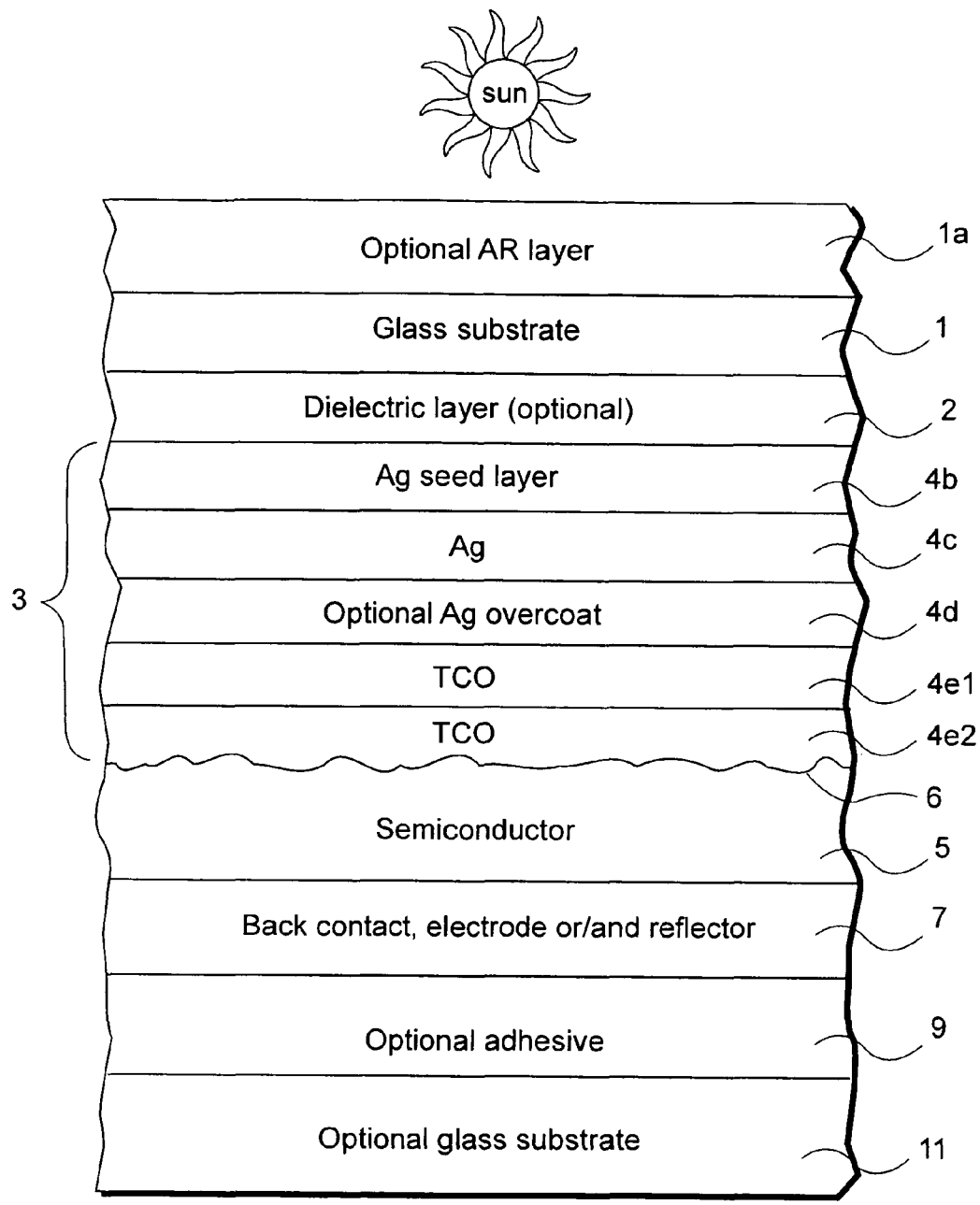
FIG. 1 is a cross sectional view of an example photovoltaic device according to an example embodiment of this invention.

Referring now more particularly to the figures in which like reference numerals refer to like parts/layers in the several views.

Figure 2:
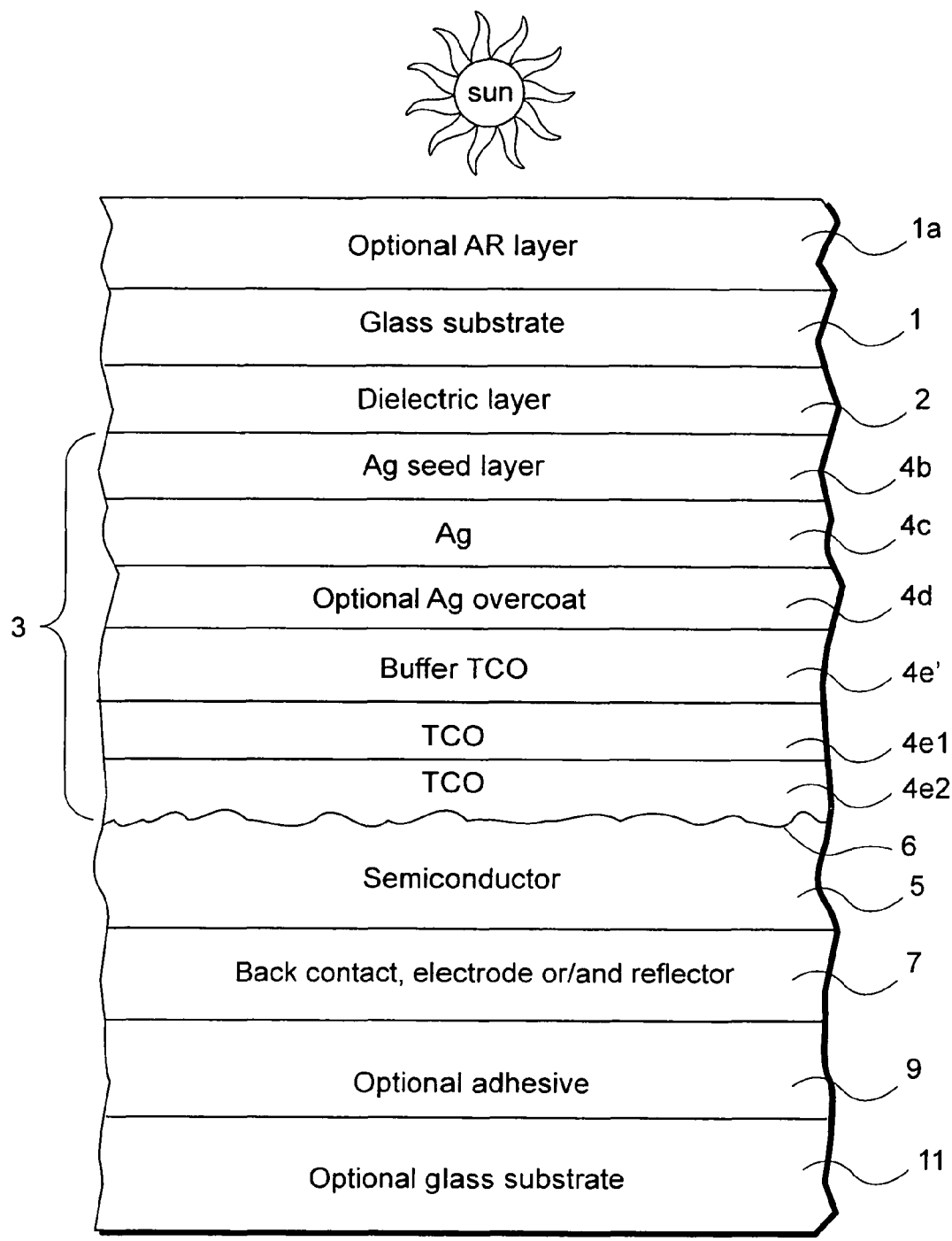
FIG. 2 is a cross sectional view of an example photovoltaic device according to another example embodiment of this invention.
Figure 3:
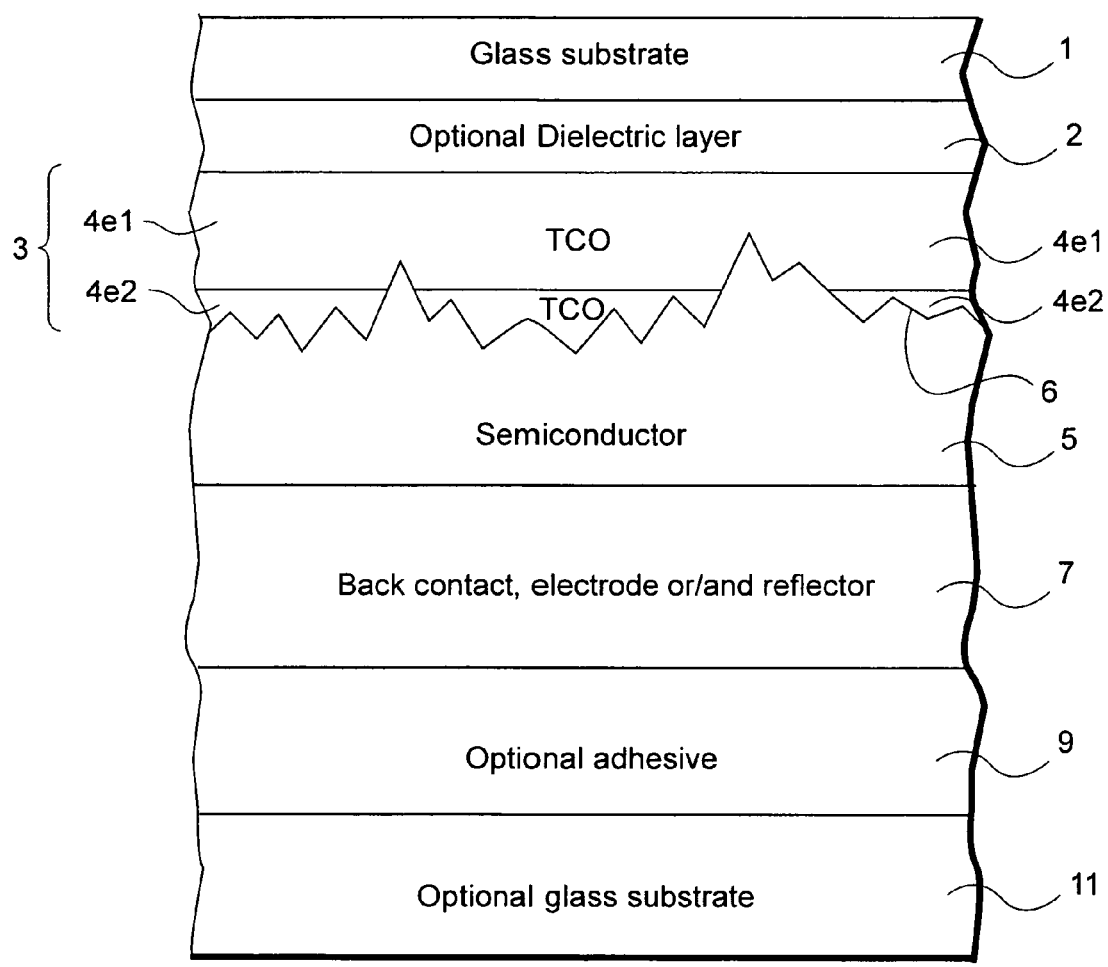
FIG. 3 is a cross sectional view of an example photovoltaic device according to another example embodiment of this invention.

Certain embodiments of this invention relate to a front electrode 3 for use in a photovoltaic (PV) device. The front electrode 3 may take various forms. In one example embodiment, as shown in FIGS. 1-2, the front electrode 3 comprises a silver-based transparent conductive coating (TCC) which has a TCO film 4e adapted to face the semiconductor film 5 of the PV device, where the TCO film 4e of the front electrode has a textured surface 6. In other example embodiments, as shown in FIG. 3 for example, the front electrode 3 may consist essentially of the TCO film 4e having a first TCO layer 4e1 and a second TCO layer 4e2 of the same or substantially the same material. In the FIG. 1-3 embodiments, a substantial part of the second TCO layer 4e2 (but little or none of the first TCO layer 4e1) of the front electrode 3 is removed during the etching process. The front electrode 3 may be used, for example, in amorphous silicon (a-Si) based photovoltaic modules. The front electrode can be deposited by sputtering techniques at room temperature in architectural coaters. The surface of the front electrode is textured by exposure to a mild etchant or the like, which does not substantially change the sheet resistance of the TCC in certain example embodiments.

In certain example embodiments (e.g., see FIGS. 1-3), the front electrode is of or includes a transparent conductive oxide (TCO) film (4e, which is the combination of 4e1 and 4e2) having first and second layers (4e1 and 4e2) of the same or substantially the same material (e.g., zinc oxide, zinc aluminum oxide, indium-tin-oxide, or tin oxide). The first TCO layer 4e1 of the front electrode is sputter-deposited using a ceramic sputtering target(s), and the second TCO layer 4e2 of the front electrode, of the same material, is sputter-deposited using a metallic or substantially metallic sputtering target(s). This allows the better quality TCO 4e1 of the film, deposited more slowly via the ceramic target(s), to be formed using the ceramic target and the lesser quality TCO 4e2 of the front electrode film to be deposited more quickly and cost effectively via the metallic target(s). Because a ceramic target is used to form layer 4e1, layer 4e1 may be more dense than layer 4e2 which is formed using a metallic target. After the etching, most or all of the better quality ceramic-deposited TCO 4e1 remains whereas much of the lesser quality metallic-deposited TCO 4e2 of the film was removed during the etching process and is no longer present. This allows the TCO of the front electrode 3 to be formed in a more efficient and cost effective manner, resulting in a better and more competitive product. In completing manufacture of the PV device, the etched surface 6 of the front electrode 3 faces the active semiconductor film 5 of the PV device.

Acid-etching of TCOs is employed for single-junction and tandem a-Si solar cells in order to scatter the transmitted light to shallow (to the substrate) angles. The resulting effect is the increased optical path of light waves, which in turn improves the charge carrier generation within the semiconductor absorber 5. Etch-texturing of ZnO:Al or other TCO is thought to be a better alternative to atmospheric CVD deposition of material such as F-doped tin oxide which is naturally textured in the form of pyramids.

Referring to the TCO films 4e of the front electrodes of FIGS. 1-3, ZnO:Al (or other TCO) layers can be sputter deposited at approximately room temperature from either ceramic ZnO:Al or metallic Zn:Al sputtering targets (e.g., rotating magnetron type sputtering targets). The ceramic targets result in a better quality and more etchable film, whereas the metallic targets offer higher line speed and thus lower production costs. During the texturing process, a considerable portion of the ZnO:Al film gets etched away, wile facilitating the formation of textured features (peaks/valleys, or hills and craters) in the lower portion of the film 4e1 (the "lower portion" or "lower layer" or "first layer" means the portion or layer of the film closest to the glass substrate 1 on which the TCO film was sputter-deposited). The deposition of the lower or first layer of ZnO:Al 4e1 using a ceramic target and the top or second layer of ZnO:Al 4e2 using a metallic target has been found to be particularly advantageous. In this respect, the TCO film has two immediately adjacent layers (4e1 and 4e2) of the same or substantially the same material (e.g., ZnO:Al). The bottom layer 4e1, which remains in whole or in large part after the etching of the top or second layer 4e2, is responsible for optimized opto-electrical properties of the TCO film 4e. The top low-cost layer 4e2 is removed, in part or entirely, during the etching process. As a result, the cost of the process is reduced due to significantly higher line speed of deposition of the second TCO layer 4e2.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material 5 (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, microcrystalline silicon, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe (including CdS/CdTe) photovoltaic devices, polysilicon and/or microcrystalline Si photovoltaic devices, and the like. This invention may be applicable especially to a-Si single junction and micromorph solar cell modules in certain example embodiments.

Referring to FIGS. 1-3, certain example embodiments of this invention relate to a photovoltaic (PV) device including an electrode such as a front electrode/contact 3 and a method of making the same. In certain example embodiments, the front electrode 3 has a textured (e.g., etched) surface 6 that faces the photovoltaic semiconductor film 5 of the PV device. The textured surface 6 of the front electrode 3, facing the semiconductor absorber film 5, is advantageous in that it increases the amount of incoming radiation or solar energy that is absorbed by the semiconductor film 5 of the PV device. In certain example embodiments, the front electrode 3 (e.g., by sputtering at about room temperature) is formed on a flat or substantially flat (non-textured) surface of a front glass substrate 1, and after formation of the front electrode 3 via sputtering at room temperature or the like, the surface of the front electrode is textured (e.g., via etching). In completing manufacture of the PV device, the textured (e.g., etched) surface 6 of the front electrode 3 faces the active semiconductor film (or absorber) 5 of the PV device. The use of a front electrode 3 having a textured surface 6 adjacent the semiconductor film (or absorber) 5 is advantageous in that it increases the optical path of incoming solar light within the semiconductor film 5 through light scattering and light trapping between the front and back electrodes, thereby increasing the chance for photons to be absorbed in the semiconductor film 5 to generate electrical charge.

In certain example embodiments of this invention, the front electrode 3 (or TCC) may be baked (or heat treated) prior to the texturing (e.g., etching). This heat treating helps densify the TCO 4e of the front electrode to be etched, thereby permitting a more uniform and predictable texturing to be achieved. Moreover, the more dense film caused by the baking/heating is less permeable to etchant(s) used in etching the TCO 4e, so as to reduce the chance of etchant(s) reaching and damaging other parts of the front electrode 3. As a result, overall performance of the resulting PV device can be achieved. In certain example embodiments of this invention, a thin buffer 4e' (e.g., see FIG. 2) may be provided adjacent the TCO 4e of the front electrode 3. The thin buffer 4e' can render the front electrode 3 less permeable to etchant(s) used in etching the TCO 4e, so as to reduce the chance of etchant reaching and damaging other parts of the front electrode such as a silver based layer 4c. As a result, overall performance of the resulting PV device can be achieved, without permitting the front electrode 3 to be undesirably damaged by the etchant(s). In certain example embodiments, the TCO 4e is at least moderately conductive (e.g., <1 kohmcm) to provide a conductive path to the silver 4c for the photocurrent generated in the semiconductor film 5.

In certain example embodiments of this invention (e.g., see FIG. 1), the front electrode 3 of a photovoltaic device is comprised of a multilayer coating including at least one conductive substantially metallic IR reflecting layer (e.g., based on silver, gold, or the like) 4c, and at least one transparent conductive oxide (TCO) film (e.g., of or including a material such as zinc oxide or the like, or one or multiple layers 4e1, 4e2) 4e. In the PV device of FIG. 1, the TCO film 4e (the combination of layers 4e1 and 4e2 in FIG. 1) is provided between the semiconductor film 5 and the substantially metallic IR reflecting layer 4c. In certain example instances, the multilayer front electrode coating may include a plurality of TCO layers and/or a plurality of conductive substantially metallic IR reflecting layers 4c arranged in an alternating manner in order to provide for reduced visible light reflections, increased conductivity, increased IR reflection capability, and so forth. In certain example embodiments of this invention, a multilayer front electrode coating (e.g., see 3) may be designed to realize one or more of the following advantageous features: (a) reduced sheet resistance ($R_s$) and thus increased conductivity and improved overall photovoltaic module output power; (b) increased reflection of infrared (IR) radiation thereby reducing the operating temperature of the photovoltaic module so as to increase module output power; (c) reduced reflection and increased transmission of light in the region(s) of from about 450-700 nm and/or 450-600 nm which leads to increased photovoltaic module output power; (d) reduced total thickness of the front electrode coating which can reduce fabrication costs and/or time; (e) an improved or enlarged process window in forming the TCO layer(s) because of the reduced impact of the TCO's conductivity on the overall electric properties of the module given the presence of the highly conductive substantially metallic layer(s); and/or (f) increased optical path within the semiconductor film, due to the etched surface 6 of the front electrode 3, through light scattering thereby increasing the chance for photons to be absorbed in the semiconductor film so as to generate additional electrical charge.

FIG. 1 is a cross sectional view of a photovoltaic device according to an example embodiment of this invention, including a multi-layer front electrode 3. The photovoltaic device includes transparent front glass substrate 1 (other suitable material may also be used for the substrate instead of glass in certain instances), optional dielectric layer(s) 2 (e.g., of or including one or more of silicon oxide, silicon oxynitride, silicon nitride, titanium oxide, niobium oxide, and/or the like) which may function as a sodium barrier for blocking sodium from migrating out of the front glass substrate 1, seed layer 4b (e.g., of or including zinc oxide, zinc aluminum oxide, tin oxide, tin antimony oxide, indium zinc oxide, or the like) which may be a TCO or dielectric in different example embodiments, silver based infrared (IR) reflecting layer 4c, optional overcoat or contact layer 4d (e.g., of or including NiCr, and/or an oxide of Ni and/or Cr, zinc oxide, zinc aluminum oxide, or the like) which may be a TCO, TCO film 4e (e.g., of or including zinc oxide, zinc aluminum oxide, tin oxide, tin antimony oxide, zinc tin oxide, indium tin oxide (ITO), indium zinc oxide, or the like), semiconductor film 5 (e.g., CdS/CdTe, a-Si, or the like), optional back contact, reflector and/or electrode 7 which may be of a TCO or a metal, optional adhesive 9 or adhesive of a material such as ethyl vinyl acetate (EVA) or the like, and optional back glass substrate 11. Semiconductor absorbing film 5 may be made up of one or more layers in different example embodiments, and may be for example pin, pn, pinpin tandem layer stacks, or the like. Of course, other layer(s) which are not shown may also be provided in the PV device of FIG. 1.

Front glass substrate 1 and/or rear superstrate (substrate) 11 may be made of soda-lime-silica based glass in certain example embodiments of this invention; and it may have low iron content and/or an antireflection coating thereon to optimize transmission in certain example instances. The surface (interior surface) of the glass substrate 1 facing the semiconductor 5 and the front electrode 3 is preferably flat or substantially flat/smooth in certain example embodiments of this invention. In other words, the interior surface of the front glass substrate 1 on which the front electrode 3 is formed is preferably non-textured. Thus, layers 2, 4b and 4c (and possibly 4d) are also preferably non-textured so that each of their respective surfaces (both major surfaces of each) are flat or substantially smooth (non-textured) in certain example embodiments of this invention. Moreover, the surface of TCO 4e closest to the front glass substrate 1 is non-textured (or smooth/flat) in certain preferred embodiments, whereas the opposite surface 6 of the TCO 4e facing the semiconductor 5 is textured (e.g., etched) as discussed herein.

While substrates 1, 11 may be of glass in certain example embodiments of this invention, other materials such as quartz, plastics or the like may instead be used for substrate(s) 1 and/or 11. Moreover, superstrate 11 is optional in certain instances. Glass 1 and/or 11 may or may not be thermally tempered in certain example embodiments of this invention. Optionally, an antireflective (AR) film (not shown) may be provided on the light incident or exterior surface of the front glass substrate 1. Additionally, it will be appreciated that the word "on" as used herein covers both a layer being directly on and indirectly on something, with other layers possibly being located therebetween.

Dielectric layer(s) 2 may be of any substantially transparent material such as a metal oxide and/or nitride which has a refractive index of from about 1.5 to 2.5, more preferably from about 1.6 to 2.5, more preferably from about 1.6 to 2.2, more preferably from about 1.6 to 2.0, and most preferably from about 1.6 to 1.8. However, in certain situations, the dielectric layer 2 may have a refractive index (n) of from about 2.3 to 2.5. Example materials for dielectric layer 2 include silicon oxide, silicon nitride, silicon oxynitride, zinc oxide, tin oxide, titanium oxide (e.g., $TiO_2$), aluminum oxynitride, aluminum oxide, or mixtures thereof. Dielectric layer(s) 2 functions as a barrier layer in certain example embodiments of this invention, to reduce materials such as sodium from migrating outwardly from the glass substrate 1 and reaching the IR reflecting layer(s) 4c and/or semiconductor 5. Moreover, dielectric layer 2 is material having a refractive index (n) in the range discussed above, in order to reduce visible light reflection and thus increase transmission of visible light (e.g., light from about 450-700 nm and/or 450-600 nm) through the coating and into the semiconductor 5 which leads to increased photovoltaic module output power. In certain example embodiments, the dielectric layer 2 may be composed of one, two or more layers of dielectric layer (e.g., a silicon nitride based layer and a titanium oxide based layer)

Multilayer front electrode 3 (or TCC) in the FIG. 1 embodiment, which is provided for purposes of example only and is not intended to be limiting, includes from the glass substrate 1 outwardly (possibly over dielectric layer(s) 2) first transparent conductive oxide (TCO) or dielectric layer 4b (e.g., of or including zinc oxide), first conductive substantially metallic IR reflecting layer 4c (e.g., of or including silver and/or gold), optional overcoat 4d of NiCr, $NiCrO_x$ or the like, and TCO film 4e (e.g., of or including zinc oxide, indium-tin-oxide (ITO), or the like). This multilayer film 3 makes up the front electrode in certain example embodiments of this invention. Of course, it is possible for certain layers of electrode 3 to be removed in certain alternative embodiments of this invention, and it is also possible for additional layers to be provided in the multilayer electrode 3 (e.g., an additional silver based layer 4c may be provided, with a TCO such as zinc oxide or ITO being provided between the two silver based IR reflecting layers 4c). Front electrode 3 may be continuous across all or a substantial portion of front glass substrate 1, or alternatively may be patterned into a desired design (e.g., stripes), in different example embodiments of this invention. Each of layers/films 1-4 is substantially transparent in certain example embodiments of this invention. The surface 6 of TCO film 4e facing the semiconductor 5 is etched as discussed herein, in order to provide for improved characteristics of the PV device.

IR reflecting layer(s) 4c may be of or based on any suitable IR reflecting material such as silver, gold, or the like. These materials reflect significant amounts of IR radiation, thereby reducing the amount of IR which reaches the semiconductor film 5. Since IR increases the temperature of the device, the reduction of the amount of IR radiation reaching the semiconductor film 5 is advantageous in that it reduces the operating temperature of the photovoltaic module so as to increase module output power. Moreover, the highly conductive nature of these substantially metallic layer(s) 4c permits the conductivity of the overall front electrode 3 to be increased. In certain example embodiments of this invention, the multi-layer electrode 3 has a sheet resistance of less than or equal to about 18 ohms/square, more preferably less than or equal to about 14 ohms/square, and even more preferably less than or equal to about 12 ohms/square. Again, the increased conductivity (same as reduced sheet resistance) increases the overall photovoltaic module output power, by reducing resistive losses in the lateral direction in which current flows to be collected at the edge of cell segments. It is noted that first (and possibly a second) conductive substantially metallic IR reflecting layer 4c (as well as the other layers of the electrode 3) are thin enough so as to be substantially transparent to visible light. In certain example embodiments of this invention, substantially metallic IR reflecting layer 4c is from about 3 to 18 nm thick, more preferably from about 5 to 10 nm thick, and most preferably from about 5 to 8 nm thick. These thicknesses are desirable in that they permit the layer 4c to reflect significant amounts of IR radiation, while at the same time being substantially transparent to visible radiation which is permitted to reach the semiconductor 5 to be transformed by the photovoltaic device into electrical energy. The highly conductive IR reflecting layer 4cs attribute to the overall conductivity of the electrode 3 more than the TCO layer(s); this allows for expansion of the process window(s) of the TCO layer(s) which has a limited window area to achieve both high conductivity and transparency. Seed layer 4b (e.g., of or including ZnO and/or ZnO:Al) is provided for supporting and allowing better crystallinity of the Ag based layer 4c. The overcoat or thin capping layer 4d may be provided over and contacting the silver based layer 4c, for improving the stability of the silver.

TCO film 4e may be of any suitable TCO material including but not limited to conducive forms of zinc oxide, zinc aluminum oxide, tin oxide, indium-tin-oxide (ITO), indium zinc oxide (which may or may not be doped with silver), or the like. TCO film 4e provides for better coupling-in of incoming solar light with the PV device, improves contact properties of the stack, and allows for good mechanical and chemical durability of the coating during shipping and/or processing. This TCO film 4e is typically substoichiometric so as to render it conductive. For example, film 4e may be made of material(s) which gives it a resistance of no more than about 10 ohm-cm (more preferably no more than about 1 ohm-cm, and most preferably no more than about 20 mohm-cm). TCO 4e may be doped with other materials such as fluorine, aluminum, antimony or the like in certain example instances, so long as it remains conductive and substantially transparent to visible light. In certain example embodiments of this invention, the TCO film 4e includes first and second layers (4e1 and 4e2, respectively) of the same or substantially the same material (see the example materials which may be used, above in this paragraph for instance). The first layer 4e1 is sputter-deposited using one or more ceramic target(s), and the second layer 4e2 of the TCO film 4e is sputter-deposited using one or more metallic or substantially metallic target(s). This ensures the desired properties of the textured surface 6.

In the FIG. 1 example embodiment, the thickness of the first TCO layer 4e1 (e.g., for a monolithic ZnO:Al TCO film 4e) may be from about 50-300 nm, more preferably from about 75-200 nm, with an example being about 100 nm. In the FIG. 1 embodiment, the thickness of the second TCO layer 4e2 may be from about 50-300 nm, more preferably from about 75-200 nm. The TCO layers 4e1 and 4e2 may be sputter-deposited at substrate temperatures ranging from room temperature to about 350 degrees C. in various embodiments.

The first layer 4e1, deposited via ceramic target(s), may be deposited with no or little oxygen gas present, while the second layer 4e2, deposited via the metallic target(s), may be deposited using a reactive sputtering process in the presence or significant oxygen gas. Inert gas (e.g., Ar) may be present in both the sputtering of layers 4e1 and 4e2. More oxygen gas is used in sputtering layer 4e2 than layer 4e2. For example, at least about twice as much (more preferably at least about 3 or 4 times as much) oxygen gas may be present in the sputtering of layer 4e2 than is present for the sputter-depositing of layer 4e1. Both TCO layers 4e1 and 4e2 may have a refractive index (n) of from about 1.9 to 2.1 in certain example embodiments. During etching, all or much of layer 4e2 is removed, leaving the structure of the TCO film shown in FIG. 1 (or FIGS. 2-3) for use in the PV device.

The surface of the TCO film 4e (after sputter-depositing of layers 4e1 and 4e2) is etched (e.g., using an etchant(s) such as acetic acid, HF acid, HBr acid, NH₃Fl, or the like—any of which may be mixed with water or the like) to provided etched surface 6, and then the structure including substrate 1 and etched front electrode 3 is coupled with the rest of the device in order to form the photovoltaic device shown in FIG. 1 (or FIGS. 2-3). An example of etching solution that may be used for the etching is a mixture of or including vinegar and water. For example, the semiconductor layer 5 may then be formed over the etched front electrode on substrate 1 so as to be adjacent etched surface 6 of the front electrode 3, and then encapsulated by the substrate 11 via an adhesive 9 such as EVA. See FIGS. 1-3 for example. For example, the stack for the front electrode 3 (including film 4e) can be exposed to a mild etchant such as diluted HCl (hydrochloric acid) or diluted CH3COOH (acetic acid) for several seconds to several minutes. The acid preferentially etches the surface of the TCO 4e (most or all of layer 4e2) to create a surface texture on surface 6 suitable for light trapping in amorphous silicon photovoltaic modules and the like. Preferably the angle of the texture (the average angle at which the peaks and/or valleys of the etched surface are provided) is from about 20-45 degrees (e.g., about 30 degrees) with respect to the horizontal. Moreover, the average surface roughness (RMS roughness—the square root of the arithmetic mean of the squares of the feature height) of etched surface 6 is from about 10-50 nm, more preferably from about 15-40 nm, and most preferably from about 20-30 nm. The peaks/valleys on etched surface 6 have an average depth from about 0.05 to 0.5 µm in certain example embodiments. Haze may be from about 6 to 20%, more preferably from about 10-15%, after the etching in certain example embodiments. Note that the haze is the haze of the front glass substrate coated with the etched TCC (not with the semiconductor on it). The above examples are non-limiting. Other mild etchants, including acids and base solutions, that do not to attack the silver 4c under the TCO overcoat 4e may also be used. Other metal oxides (tin oxide, ITO, etc.) may also be used as the TCO 4e. When stronger etchants are used, intermediate layer(s) (e.g., tin oxide) (e.g., see buffer layer 4e' in FIG. 2) as etch stop to protect silver 4c may be provided. For example, tin oxide can be more resistant to acid etching than ZnO and ITO. In other words, in such alternatively, the Ag based layer 4c may be coated first by an etch-resistant thin buffer layer (e.g., tin oxide or other moderately conductive transparent oxide such as layer 4e' in FIG. 2), followed by the TCO 4e such as ZnO:Al.

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. The p-type a-Si layer of the semiconductor film 5 may be the uppermost portion of the semiconductor film 5 in certain example embodiments of this invention; and the i-layer is typically located between the p and n-type layers. These amorphous silicon based layers of film 5 may be of hydrogenated amorphous silicon in certain instances, but may also be of or include hydrogenated amorphous silicon carbon or hydrogenated amorphous silicon germanium, hydrogenated microcrystalline silicon, or other suitable material(s) in certain example embodiments of this invention. It is possible for the active region 5 to be of a double-junction or triple-junction type in alternative embodiments of this invention. CdTe may also be used for semiconductor film 5 in alternative embodiments of this invention.

Back contact, reflector and/or electrode 7 may be of any suitable electrically conductive material. For example and without limitation, the back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). The TCO of the back contact 7 may be of the single layer type or a multi-layer type in different instances. Moreover, the back contact 7 may include both a TCO portion and a metal portion in certain instances. For example, in an example multi-layer embodiment, the TCO portion of the back contact 7 may include a layer of a material such as indium zinc oxide (which may or may not be doped with silver), indium-tin-oxide (ITO), tin oxide, and/or zinc oxide closest to the active region 5, and the back contact may include another conductive and possibly reflective layer of a material such as silver, molybdenum, platinum, steel, iron, niobium, titanium, chromium, bismuth, antimony, or aluminum further from the active region 5 and closer to the superstrate 11. The metal portion may be closer to superstrate 11 compared to the TCO portion of the back contact 7.

The photovoltaic module may be encapsulated or partially covered with an encapsulating material such as encapsulant 9 in certain example embodiments. An example encapsulant or adhesive for layer 9 is EVA or PVB. However, other materials such as Tedlar type plastic, Nuvasil type plastic, Tefzel type plastic or the like may instead be used for layer 9 in different instances.

While the electrode 3 is used as a front electrode in a photovoltaic (PV) device in certain embodiments of this invention described and illustrated herein, it is also possible to use the electrode 3 as another electrode in the context of a photovoltaic device or otherwise.

For purposes of example only, an example of the FIG. 1 embodiment is as follows (note that certain optional layers shown in FIG. 1 are not used in this example). For example, referring to FIG. 1, front glass substrate 1 (e.g., about 3.2 mm thick), dielectric layer 2 (e.g., silicon oxynitride about 20 nm thick possibly followed by dielectric TiOx about 20 nm thick), Ag seed layer 4b (e.g., dielectric or TCO zinc oxide or zinc aluminum oxide about 10 nm thick), IR reflecting layer 4c (silver about 5-8 nm thick), optional overcoat of or including NiCr and/or NiCr$O_x$ 4d, and TCO film 4e. The TCO 4 is etched to provide textured or etched surface 6. The photovoltaic device of FIG. 1 (or any other embodiment herein) may have a sheet resistance of no greater than about 18 ohms/square, more preferably no grater than about 14 ohms/square, even more preferably no greater than about 12 ohms/square in certain example embodiments of this invention. Moreover, the FIG. 1 embodiment (or any other embodiment herein) may have tailored transmission spectra having more than 80% transmission into the semiconductor 5 in part or all of the wavelength range of from about 450-600 nm and/or 450-700 nm, where AM1.5 may have the strongest intensity and in certain example instances the cell may have the highest or substantially the highest quantum efficiency.

For purposes of example only, another example of the FIG. 1 embodiment is as follows. The photovoltaic device may include: optional antireflective (AR) layer 1a on the light incident side of the front glass substrate 1; first dielectric layer 2 of or including one or more of silicon nitride (e.g., $Si_3N_4$ or other suitable stoichiometry), silicon oxynitride, silicon oxide (e.g., $SiO_2$ or other suitable stoichiometry), and/or tin oxide (e.g., $SnO_2$ or other suitable stoichiometry); seed layer 2 (which may be a dielectric or a TCO) of or including zinc oxide, zinc aluminum oxide, tin oxide, tin antimony oxide, indium zinc oxide, or the like; conductive silver based IR reflecting layer 4c; overcoat or contact layer 4d (which may be a dielectric or conductive) of or including an oxide of Ni and/or Cr, NiCr, Ti, an oxide of Ti, zinc aluminum oxide, or the like; and TCO film 4e; semiconductor film 5 of or including one or more layers such as CdS/CdTe, a-Si, or the like; optional back contact/electrode/reflector 7 of aluminum or the like; optional adhesive 9 of or including a polymer such as PVB or EVA; and optional back/rear glass substrate 11. In certain example embodiments of this invention, dielectric layer 2 may be from about 5-40 nm thick, more preferably from about 10-20 nm thick; seed layer 4b may be from about 5-20 nm thick, more preferably from about 5-15 nm thick; silver based layer 4c may be from about 5-20 nm thick, more preferably from about 6-10 nm thick; overcoat layer 4d may be from about 0.2 to 5 nm thick, more preferably from about 0.5 to 2 nm thick; and TCO film 4e after etching may be from about 50-250 nm thick, more preferably from about 75-150 nm thick, and may have a resistivity of no more than about 100 m$\Omega$ in certain example instances. Moreover, the surface of glass 1 closest to the sun may be patterned via etching or the like in certain example embodiments of this invention.

In certain example embodiments, the front electrode 3, prior to etching, can be subjected to baking (or heat treating). In certain example embodiments, the heat treating may be from about 50 to 400 degrees C., more preferably from about 100 to 400 degrees C. (more preferably from about 150-350 degrees C.), for a time of from about 5 to 60 minutes, more preferably from about 10 to 60 minutes, more preferably from about 20-50 minutes. An example heat treatment is for 30 min at 270 degrees C. Following the heat treatment, the heat treated (baked) front electrode 3 is etched using acetic acid or the like in order to form the textured/etched surface 6 thereof. Then, the front substrate 1 with the front electrode 3 having etched surface 6 thereof is used in finishing the PV device so that the etched surface 6 faces, and preferably abuts, the semiconductor film 5 of the PV device in the final product. It is noted that the total thickness of the as-deposited TCO film 4e may be from about 100-500 nm, and the post-etch thickness may be from about 20-300 nm for the film 4e in certain example embodiments of this invention. It is noted that in any embodiment herein, hydrochloric acid may be used as the etchant to form etched surface 6, instead of or in addition to acetic acid or the like. When using acetic acid and/or hydrochloric acid to etch the TCO 4e, the acid concentration may be from about 0.5 to 20%, more preferably from about 1-10%, with an example being about 3.5%, in certain example embodiments of this invention. The etch time may be from about 10-400 seconds, more preferably from about 100-300 seconds, with an example being about 200 seconds, in certain example embodiments of this invention.

FIG. 2 illustrate a PV device according to another example embodiment of this invention. The FIG. 2 PV device is the same as the FIG. 1 embodiment described above, except that additional buffer TCO layer 4e' is also provided. The TCO layer 4e' may be of tin oxide, zinc oxide, or the like in certain example embodiments of this invention.

FIG. 3 illustrates a PV device according to another example embodiment of this invention. The FIG. 3 PV device is the same as the FIG. 1 PV device described above, except that layers 4b, 4c and 4d of the FIG. 1 embodiment are omitted in the FIG. 3 embodiment. In the FIG. 3 embodiment, the front electrode 3 is made up mainly or entirely of the TCO film 4e, which was formed by sputter-depositing TCO layers 4e1 and 4e2 of the same or substantially the same material as discussed above (e.g., zinc oxide, zinc aluminum oxide, tin oxide, ITO, or the like), with layer 4e2 then being etching away in large part thereby resulting in the front electrode structure shown in FIG. 3. In the FIG. 3 embodiment, the first layer 4e1 may be sputter-deposited using a ceramic target(s) to a thickness of from about 200-700 nm, more preferably from about 300-500 nm, with an example thickness being about 400 nm. The second TCO layer 4e2 may be sputter-deposited to a thickness of from about 50-300 nm, more preferably from about 75-200 nm (prior to etching). In any of the FIG. 1-3 embodiments, the etching may be performed to an extent such that some portions of the first layer 4e1 are exposed as a result of the etching (i.e., the second layer 4e2 is continuous prior to the etching, but discontinuous after the etching to form etched surface 6 of the TCO film 4e). While layers 4e1 and 4e2 may be of or include zinc oxide in certain example embodiments, other material which may be used including zinc aluminum oxide, tin oxide, ITO, or the like.

Figure 4:
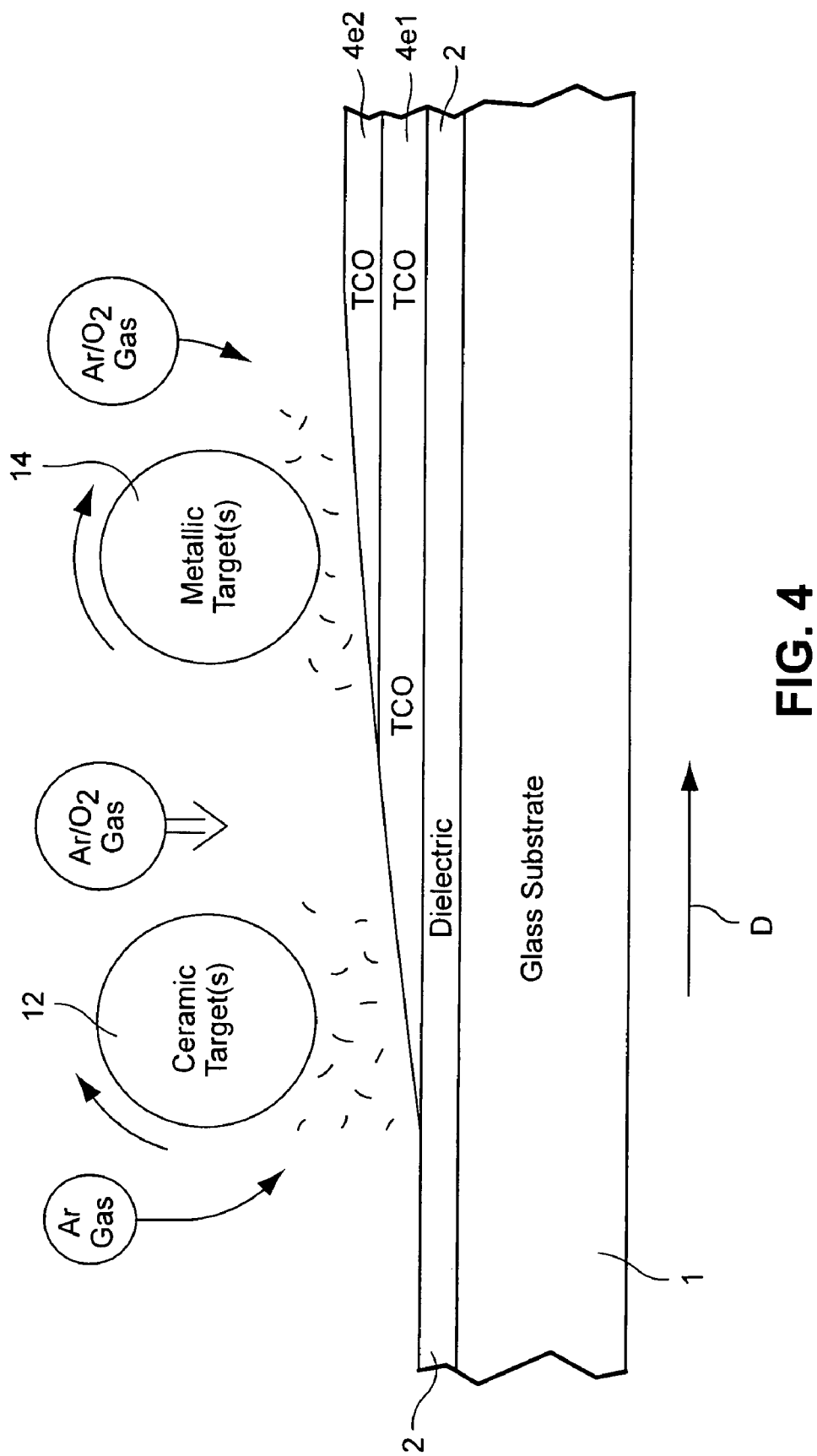
FIG. 4 is a schematic diagram illustrating how a TCO film of the front electrode may be made according to any of the FIG. 1-3 embodiments of this invention, according to an example embodiment of this invention.
Figure 5:
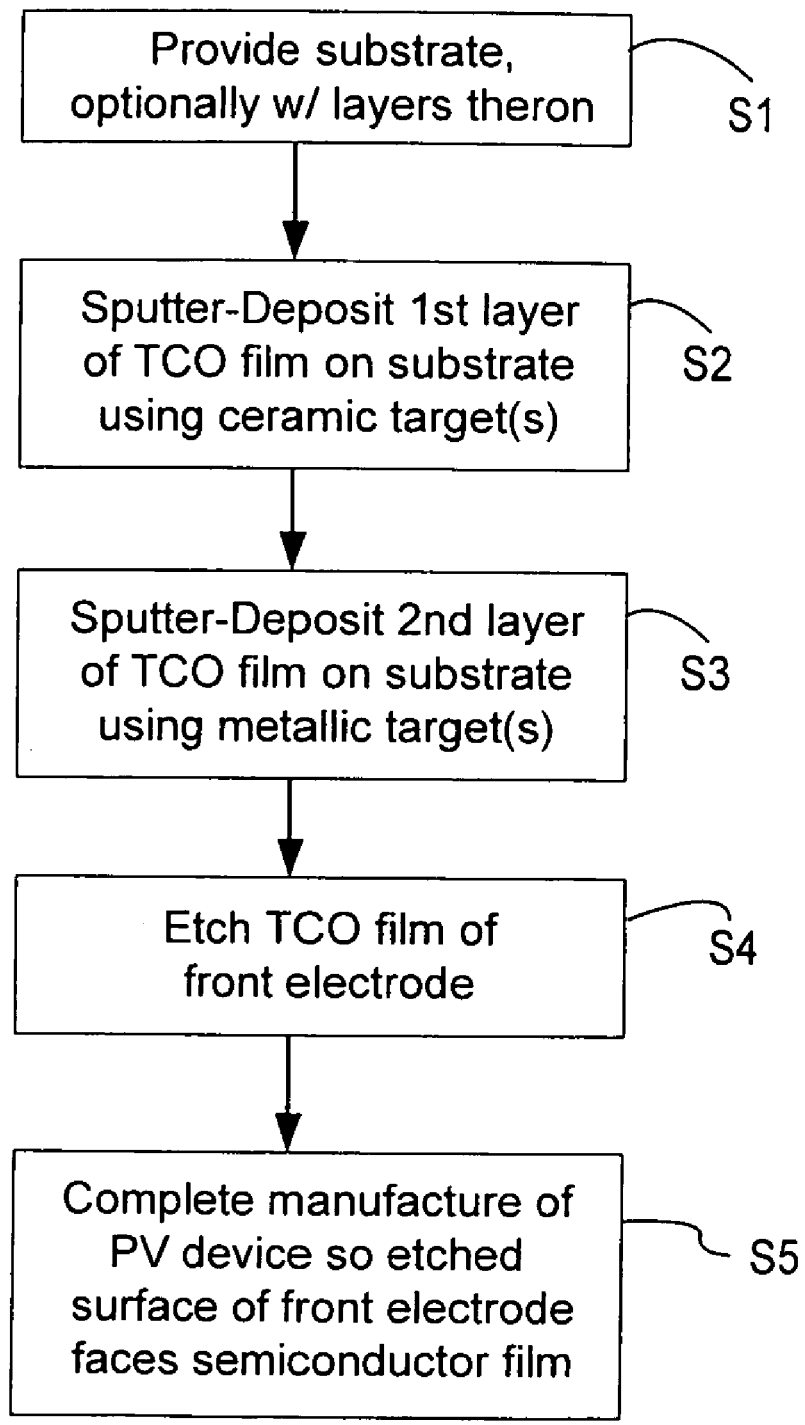
FIG. 5 is a flowchart illustrating certain steps performed in making a photovoltaic device, or a front electrode for such a photovoltaic device, according to an example embodiment of this invention.

FIG. 4 is a schematic diagram showing formation of the TCO film 4e in any of the FIG. 1-3 embodiments discussed above, and FIG. 5 is a flowchart illustrating steps performed in forming the TCO film 4e of the front electrode 3 in any of the FIG. 1-3 embodiments discussed above, according to an example embodiment of this invention. A glass substrate 1 is provided, optionally with one or more of layers 2, 4b, 4c and/or 4d thereon (see step S1 in FIG. 5). Then, the first TCO layer 4e1 is sputter-deposited on the substrate 1 (e.g., over optional dielectric layer(s) 2) using a ceramic target(s) 12 (see step S2 in FIG. 5). If the first TCO layer 4e1 is of zinc oxide, then a ZnO target(s) 12 is used to sputter deposit the layer 4e1. Likewise, if the first TCO layer 4e1 is of zinc aluminum oxide, then a ZnO:Al target 12 is used to sputter deposit the layer 4e1. As another example alternative, if the first TCO layer 4e1 is of ITO, then an ITO sputtering target 12 is used to sputter deposit the layer 4e1. Then, the second TCO layer 4e2 (of the same metal oxide material as the first layer 4e1) is sputter-deposited on the substrate 1 (e.g., over optional dielectric layer(s) 2) using a metallic target(s) 14 (see step S3 in FIG. 5). If the second TCO layer 4e2 is of zinc oxide, then a Zn metallic target(s) 14 is used to sputter deposit the layer 4e2 in the presence of Ar and oxygen gas for example. Likewise, if the second TCO layer 4e2 is of zinc aluminum oxide, then a Zn:Al metallic target 14 is used to sputter deposit the layer 4e2. As another example alternative, if the second TCO layer 4e2 is of ITO, then an indium; tin metallic sputtering target 14 is used to sputter deposit the layer 4e2. The sputtering targets 12 and 14 may be magnetron type rotating targets in certain example embodiments, and the substrate may move past the targets in direction D as shown in FIG. 4 for example. Then, after the layers 4e1 and 4e2 have been sputter-deposited, and optionally heat treated, the film 4e is etched as described above to form the etched surface 6 of the front electrode 3 (see step S4 in FIG. 5). After the etching, the semiconductor film 5 is formed and the front substrate with the electrode 3 thereon is coupled to the rear substrate 11 to form the PV device (see step S5 in FIG. 5).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making an electrode for a photovoltaic device, the method comprising:
sputter-depositing a first transparent conductive oxide layer on a substrate using at least one ceramic sputtering target;
sputter-depositing a second transparent conductive oxide layer using at least one metallic sputtering target to form a transparent conductive oxide film comprising the first and second transparent conductive oxide layers, wherein the second transparent conductive oxide layer directly contacts the first transparent conductive oxide layer and is of the same metal oxide material as the first transparent conductive oxide layer; and
after said sputter-depositing steps, etching the transparent conductive oxide film to form a textured surface, wherein a substantial portion of the second transparent conductive oxide layer is removed during said etching and a majority of said first transparent conductive oxide layer remains after said etching.

2. The method of claim 1, further comprising heat treating the transparent conductive oxide film at from about 50-400 degrees C. in order to densify at least part of the transparent conductive oxide film prior to said etching, and performing said etching after said heat treating.

3. The method of claim 1, further comprising arranging the textured surface of the transparent conductive oxide film so as to face a semiconductor film of the photovoltaic device after said etching.

4. The method of claim 1, wherein said etching etches through an entirety of some portions of the second transparent conductive oxide layer, so that after said etching some but not all of the first transparent conductive oxide layer is exposed.

5. The method of claim 1, wherein each of the first and second transparent conductive oxide layers comprise zinc oxide.

6. The method of claim 1, wherein each of the first and second transparent conductive oxide layers comprise zinc aluminum oxide.

7. The method of claim 1, wherein each of the first and second transparent conductive oxide layers comprise tin oxide.

8. The method of claim 1, wherein each of the first and second transparent conductive oxide layers comprise ITO.

9. The method of claim 1, wherein the electrode further comprises a layer comprising Ag located between the transparent conductive oxide film and the substrate.

10. The method of claim 1, wherein the substrate is a glass substrate.

11. The method of claim 1, wherein at least twice as much oxygen gas is used in sputter-depositing the second transparent conductive oxide layer as is used in sputter-depositing the first transparent conductive oxide layer.

12. The method of claim 1, wherein following said sputter-depositing steps but prior to said etching, the first transparent conductive oxide layer is substantially thicker than the second transparent conductive oxide layer.

13. The method of claim 1, wherein the etching comprises exposing the surface of the transparent conductive oxide film to one or more of acetic acid and hydrochloric acid.

14. The method of claim 1, wherein the etching is performed so that the resulting textured surface has an average RMS roughness value of from about 10-50 nm.

15. The method of claim 1, wherein the etching is performed using a mixture comprising vinegar and water.

* * * * *